United States Patent [19]

Rostoker

[11] Patent Number: 5,648,655
[45] Date of Patent: *Jul. 15, 1997

[54] SENSING DEVICE FOR CAPTURING A LIGHT IMAGE

[75] Inventor: Michael D. Rostoker, San Jose, Calif.

[73] Assignee: LSI Logic Corporation, Milpitas, Calif.

[*] Notice: The term of this patent shall not extend beyond the expiration date of Pat. No. 5,519,205.

[21] Appl. No.: 578,746

[22] Filed: Dec. 26, 1995

Related U.S. Application Data

[63] Continuation of Ser. No. 287,204, Aug. 8, 1994, Pat. No. 5,519,205, which is a continuation of Ser. No. 17,202, Feb. 11, 1993, abandoned, which is a continuation-in-part of Ser. No. 954,958, Sep. 30, 1992, abandoned.

[51] Int. Cl.⁶ .................................................. H01J 40/14
[52] U.S. Cl. ...................... 250/208.1; 250/226; 250/216; 359/565
[58] Field of Search ......................... 250/208.1, 208.2, 250/216, 226; 358/482, 483; 359/565

[56] References Cited

U.S. PATENT DOCUMENTS

| | | | |
|---|---|---|---|
| 5,340,978 | 8/1994 | Rostoker et al. | 250/208.1 |
| 5,432,333 | 7/1995 | Rostoker et al. | 250/208.1 |
| 5,519,205 | 5/1996 | Rostoker | 250/216 |
| 5,529,936 | 6/1996 | Rostoker | 437/2 |

*Primary Examiner*—Stephone Allen

[57] ABSTRACT

A camera comprising various arrangements for employing optical elements in association with photosensitive elements are described. In some of the arrangements, the optical elements are formed integrally with a substrate containing the photosensitive elements. In other arrangements, an optical element is mounted to a package, or the like, containing the substrate and photosensitive elements. In other arrangements, two or more optical elements are employed, including conventional refractive elements, refractive focusing elements, and refractive beam splitting elements. Utility as solid state image sensors is discussed. Utility for monochromatic and color imaging is discussed. Various devices based on such camera arrangements and methods of making same are discussed.

30 Claims, 10 Drawing Sheets

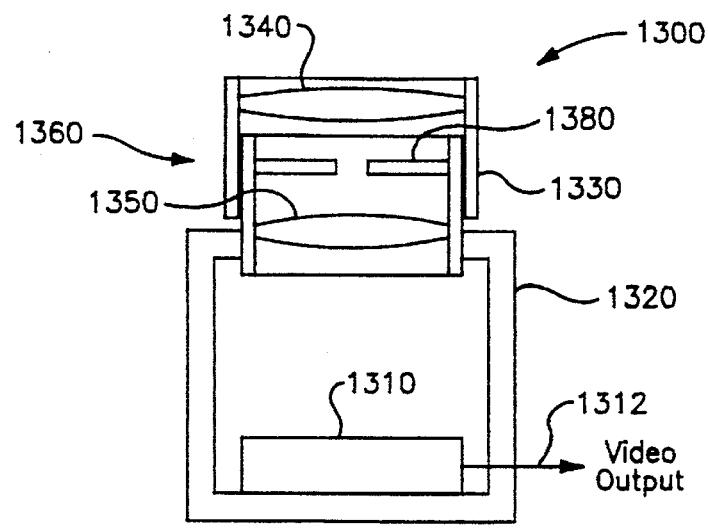
Figure 13
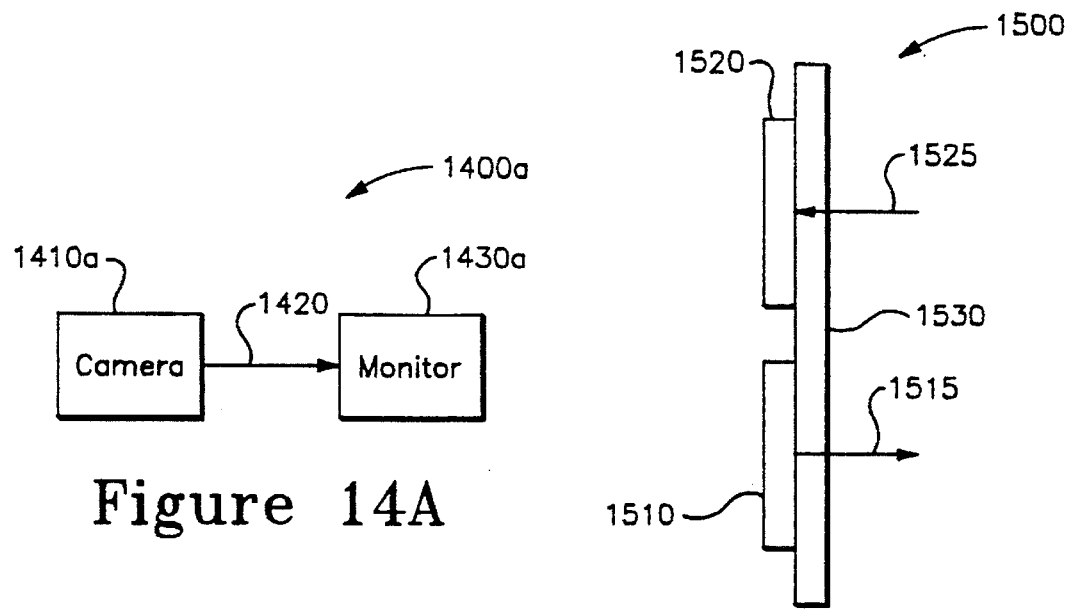
Figure 14A
Figure 15
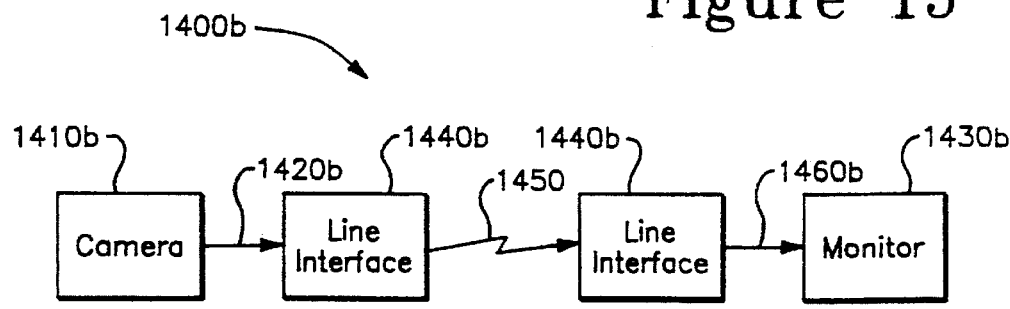
Figure 14B

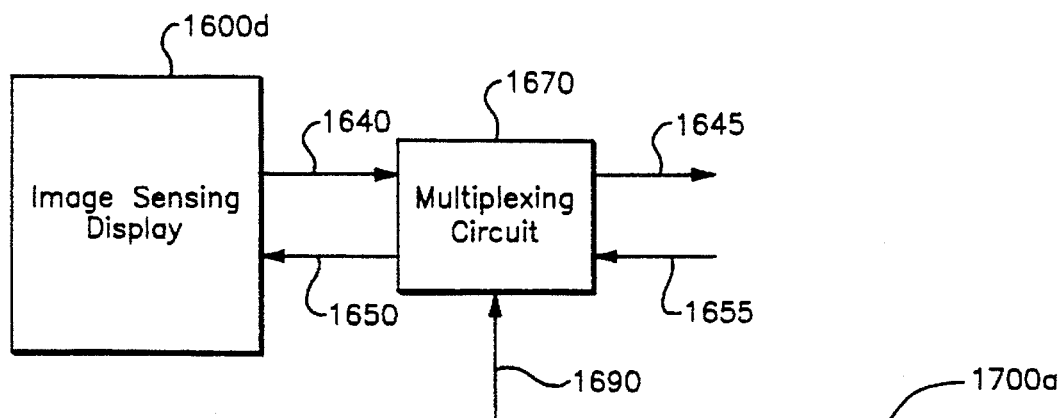
Figure 16D
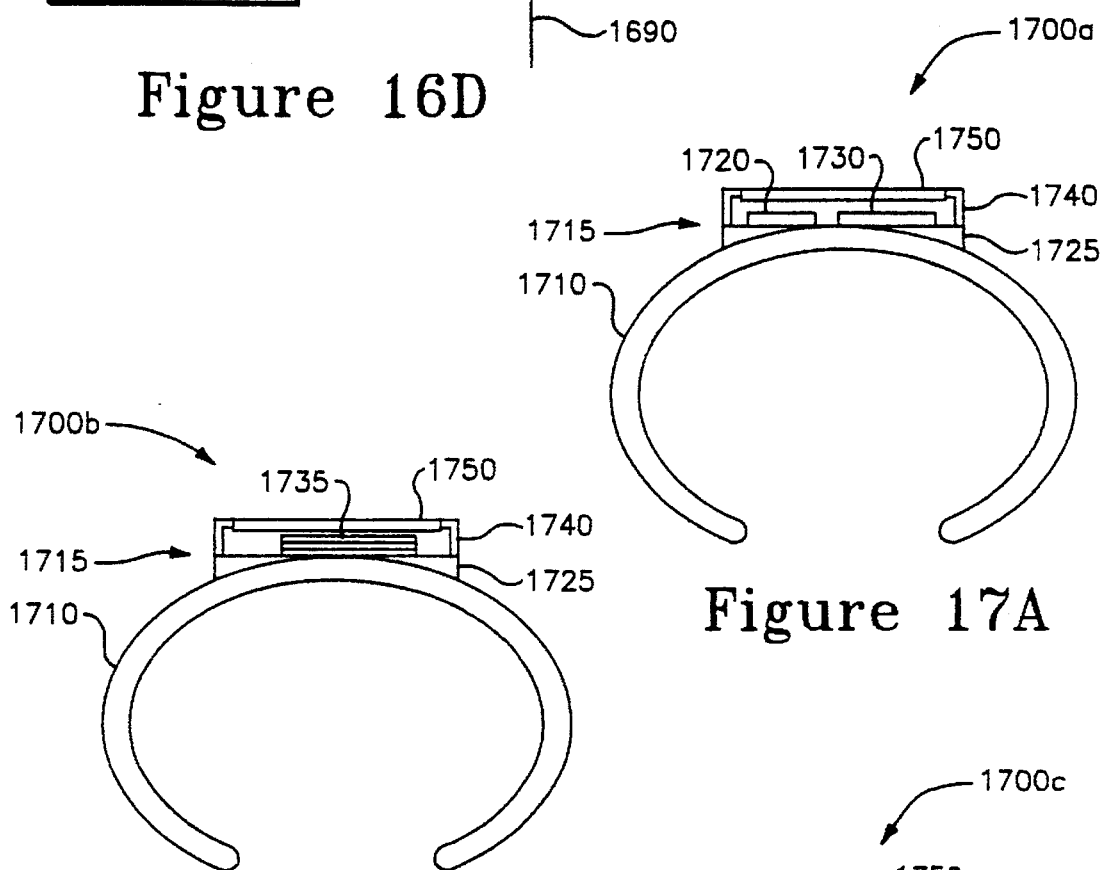
Figure 17A
Figure 17B
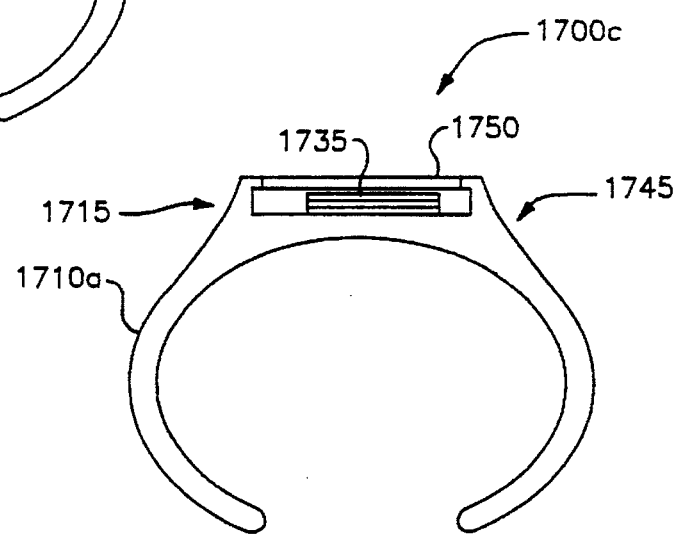
Figure 17C

SENSING DEVICE FOR CAPTURING A LIGHT IMAGE

CROSS-REFERENCE TO RELATED APPLICATIONS

This application is a continuation of U.S. patent application Ser. No. 08/287,204, filed Aug. 8, 1994, now U.S. Pat. No. 5,519,205, which is a continuation of U.S. patent application Ser. No. 08/017,202, filed Feb. 11, 1993, now abandoned, which is a continuation-in-part of U.S. patent application Ser. No. 07/954,958, filed Sep. 30, 1992, now abandoned.

TECHNICAL FIELD OF THE INVENTION

The invention relates to devices which incorporate display panels, such as a liquid crystal display (LCD).

BACKGROUND OF THE INVENTION

Modern charge-coupled devices and other photosensitive semiconductor devices (hereinafter "solid state image sensors") are capable of providing signals representing images formed (focused) on a surface thereof. Generally, the surface of a solid state image sensor is provided with an array (for example, rows and columns) of discrete photosensitive semiconductor elements (for example gates or Junctions), and particular array locations correspond to a particular "pixel" (or position) in the image. Modern video cameras, for example, Use discrete lens systems (optics) to focus images onto such solid state image sensors.

Generally, a single "taking" lens is supported at a fixed distance, such as at least several or tens of millimeters, from the array of photosensitive elements, sot hat an image may be focused onto the array. The array is located at the focal plane of the lens. Additional lenses, in front of the taking lens, provide for focusing and image enlargement.

Binary (diffractive) optical elements are discussed in "Binary Optics", Scientific American, May, 1992, pages 92, 94–97 ("Article"), incorporated by reference herein.

U.S. Pat. No. 4,425,501 discloses a transparent member 20 upon which a plurality of lenslets have been formed. The member is "mounted above" the die 10. Each lenslet is associated with a pair of detectors on the die.

U.S. Pat. No. 4,553,035 discloses in FIG. 3A two one-dimensional arrays 21 of photodetectors juxtaposed to a cylindrical lens 21. Also, as shown in FIG. 14, three rows of one-dimensional sensors may be provided, and red (R), green (G) and blue (B) filters may be installed, whereby signals of each sensor may be independently read to obtain color information.

U.S. Pat. No. 4,636,631 discloses a lens 8 assembled to a wafer 2 on a substrate 1, with thickness-calibrating shims 6,7 and with a layer of photoresist 5.

U.S. Pat. No. 4,733,096 discloses in FIG. 2 a lens structure ("sensor substrate" 32; 32a, 32b, 38). An insulating layer 42 is Juxtaposed with the lens structure 32. Sensors 44 are juxtaposed with the insulating layer 42.

DISCLOSURE OF THE INVENTION

It is an object of the present invention to provide an improved solid state image sensor.

It is a further object of the invention to provide a method of making such an image sensor.

It is a further object of the present invention to provide a solid state image sensor with integral optics.

It is a further object to provide solid state image sensors useful for color imaging.

It is a further object to provide a method of imaging using a solid state image sensor.

It is a further object of the present invention to provide an imaging apparatus. In a preferred embodiment, the apparatus comprises a camera. Preferably, the camera includes the solid state image sensor discussed above.

It is a further object of the present invention to provide a television camera based on the solid-state image sensor discussed above.

It is a further object of the present invention to provide various other camera and LCD devices based on the solid-state image sensor discussed above.

According to the invention, an optically-transmissive layer is integrally formed over a substrate having an array of photosensitive elements on its surface. The layer is provided with an array of lenslets, preferably binary optics. There is a one-to-one correspondence between the lenslets and the photosensitive elements. The lenslets are physically or virtually offset from the photosensitive elements, so that each photosensitive element provides a unique pixel of information corresponding to a unique position of an incident image. In aggregate, the photosensitive elements provide a complete two-dimensional representation of the incident image. Further according to the invention, the photosensitive elements can be arranged in regular, irregular, square or rectangular arrays.

Further according to the invention, the array of photosensitive elements may cover substantially the entire underlying substrate, or may cover only a selected area (e.g., a central area) of the substrate.

Further according to the invention, an opaque masking layer can be interposed between the lenslet layer and the photosensitive elements, and the masking layer can be provided with holes aligned with the photosensitive elements. In this manner, light focused by a lenslet that is not incident on a photosensitive element is prevented from impacting circuit elements which may be disposed on the substrate between the photosensitive elements.

Further according to the invention, an optically-transmissive layer may be interposed between the lenslet-containing layer and the photosensitive elements. This layer acts as an integral standoff between the substrate and the lenslet-containing layer.

Further according to the invention, both an optically-transmissive and a masking layer can be interposed between the lenslet-containing layer and the surface of the substrate. The optically-transmissive layer may be disposed over the masking layer, or vice-versa.

Further according to the invention, various materials and techniques are described for the lenslet-containing layer, the masking layer and the optically-transmissive (interposed) layer. Further according to the invention, the lenslets are preferably formed as diffractive (rather than as refractive) optical devices.

In an alternate embodiment of the invention, a focusing element is supported by a package body, or the like, above the surface of a substrate.

Further according to the invention, a first optical element is supported by a package body, or the like, above the surface of a substrate, and a second optical element is integrally formed on the substrate. These two optical elements may cooperate to minimize spherical and/or chromatic aberrations exhibited by either of the optical elements.

Further according to the invention, photosensitive elements are arranged in closely spaced "triads" (or "triplets"), and the triads are arranged in an array. An overlying optically-transmissive layer has lenslets formed therein. One lenslet is associated with each triad of photosensitive elements. The lenslet is preferably a diffractive device that is capable of focusing different wavelengths (e.g., red, green, blue) of incident light onto particular one of the three photosensitive elements of a triad.

Further according to the invention, three monochromatic image sensors are juxtaposed in a linear array, a curved array, or a triangular pattern. An additional optical element serves as a beam splitter, and directs different wavelengths of incident light onto a particular on a of the three monochromatic image sensors.

In an embodiment of the invention, a television camera may be provided, comprising a camera housing and an image sensor of the type discussed above mounted within the camera housing.

According to one feature of the invention, the aforementioned television camera may be provided in a housing mounted to a bracelet-type band which is sized to fit around a human wrist.

According to another feature of the invention, the housing is formed integrally with at least a portion of a bracelet-type band which is sized to fit around a human wrist.

According another feature of the invention, the housing is sized and shaped to facilitate attachment to a telescope eyepiece.

According to another feature of the invention, the housing is sized and shaped to facilitate attachment to a microscope eyepiece.

Another television camera embodiment further comprises a fixed-focus optical-system mounted above the image sensor.

Another television camera embodiment further comprises a variable-focus optical system mounted above the image sensor.

Various embodiments are directed to a security system based on a camera of the type discussed above in combination with a video display monitor.

Various other embodiments are directed to a video-phone system based upon a camera of the type discussed above, a video display monitor, and means to transmit and receive a video signal from the camera across a communications line to the video display monitor.

Further according to the invention, an image-sensing display panel comprises an LCD display panel; a substrate having an array of photosensitive elements disposed on a surface of the substrate, and an optically transmissive layer above and contiguous with the array, wherein said transmissive layer is capable of focusing light onto said array.

According to a feature of the invention, the LCD display panel and the substrate are aligned along the same optical path.

According to a feature of the invention, the LCD display panel, the optically transmissive medium (layer) and the substrate are aligned along the same optical path.

Other objects, features and advantages of the invention will become apparent in light of the following description thereof.

BRIEF DESCRIPTION OF THE DRAWINGS

FIG. 13 is a cross-sectional view of a television camera incorporating a solid-state image sensor according to the invention.

FIG. 14A is a block diagram of a security system incorporating a solid state image sensor according to the invention.

FIG. 14B is a block diagram of a video-telephone system incorporating a solid state image sensor according to the invention.

FIG. 15 is a partially diagrammatic, partially schematic view of a combined display and solid state image sensor arrangement.

FIG. 16D is a block diagram of a multiplexing system for simultaneous display and image capture, according to the invention.

FIGS. 17A–17C are views of various embodiments of combined display and image sensor arrangements affixed to a bracelet-type band, according to the invention.

DETAILED DESCRIPTION OF THE INVENTION

Figure 1:
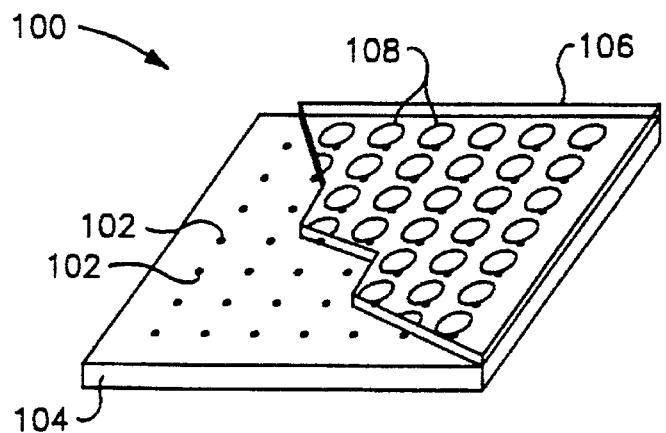
FIG. 1 is a partially cut-away, perspective view of the basic solid state image sensor, according to the present invention.
Figure 1A:
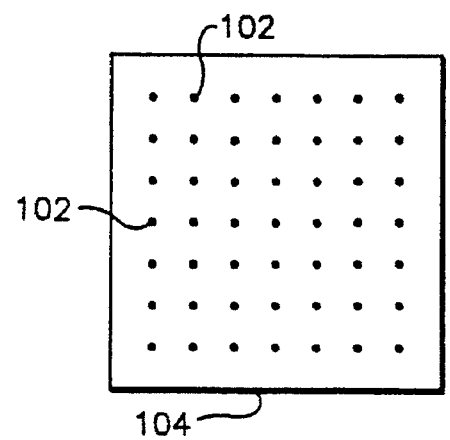
FIG. 1A is a plan view of the surface of a substrate having an array of photosensitive elements, according to the present invention.
Figure 1B:
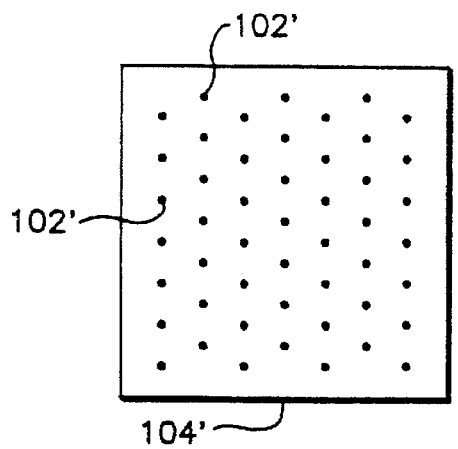
FIG. 1B is a plan view of an alternate embodiment of the surface of a substrate having an array of photosensitive elements, according to the present invention.

FIG. 1 show a solid state image sensor 100. A plurality of photosensitive elements 102 (shown as dots "●") are formed on the front surface (up, in the figure) of a substrate 104. The photosensitive elements 102 may be memory cells which discharge upon incidence of light, a CCD array, or any other suitable device which changes state or generates a potential or potential difference upon incidence of light. The substrate 104 may be a silicon semiconductor die. Other suitable semiconducting materials may also be used. The photosensitive elements 102 are arranged in an array of hundreds or thousands of rows and columns (only six rows and columns shown, for clarity). Preferably, the photosensitive elements are arranged in a square (m×m) or rectangular (m×n) array of evenly spaced elements. However, the photosensitive elements of one row (or column) can be offset from the elements of an adjacent row (or column). In FIG. 1A, the photosensitive elements 102 are arranged in a square array, and are arranged in columns and rows. In FIG. 1B, the photosensitive elements 102' are arranged in a rectangular array on the surface of a substrate 104', and the photosensitive elements 102' of one row (or column) are offset from the photosensitive elements 102' of adjacent rows (or columns).

Figure 1C:
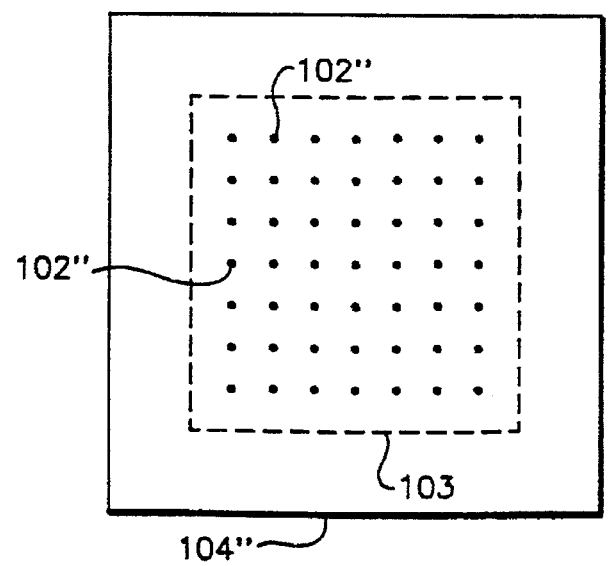
FIG. 1C is a plan view of an yet another embodiment of the surface of a substrate having an array of photosensitive elements, according to the present invention.

Returning to FIG. 1, an optically-transmissive layer 106 is applied over the substrate, covering at least the entire array of elements 102 (or 102', or 102" discussed hereinbelow). Although the elements 102 are shown covering-substantially the entire surface of the substrate, it is within the scope of this invention that the array of elements occupies only a selected area, such as a central area 103' (dashed lines), of the substrate 104", as shown in FIG. 1C, where the photosensitive elements 102" cover only a central area 103 of the substrate 104".

In FIG. 1A, the photosensitive elements of one row are aligned with the photosensitive elements of an adjacent row, and the photosensitive elements of one column are aligned with the photosensitive elements of an adjacent column.

In FIG. 1B, the photosensitive elements of one row are offset from (located orthogonally between) the photosensitive elements of an adjacent row, and the photosensitive elements of one column are offset from the photosensitive elements of an adjacent column.

Returning to FIG. 1, the layer 106 is formed of a suitably optically-transmissive material, such as silicon dioxide ($SiO_2$), spin-on glass, re-flow glass, photoresist, spin-on photoresist, re-flow photoresist, or the like, and is preferably of substantially uniform thickness. Spin-on and re-flow techniques provide relatively uniform thickness layers. In the event that the thickness of the layer 106 is non-uniform, as initially applied, it is preferably planarized by chemical-mechanical polishing techniques, or the like. For a description of chemical-mechanical polishing techniques, see (e.g.) U.S. Pat. Nos. 4,671,851, 4,910,155 and 4,944,836, incorporated by reference herein.

Alternatively, the layer 106 can be applied as a sedimentary layer of relatively uniform thickness, as discussed in commonly-owned, co-pending U.S. patent application Ser. No. 906,902, entitled SEDIMENTARY DEPOSITION OF PHOTORESIST ON SEMICONDUCTOR WAFERS, filed Jun. 29, 1992 by Rostoker.

The thickness of the layer can be verified by optical interference techniques, or the like, and adjusted to an appropriate final thickness.

As shown in FIG. 1, the layer 106 is provided with a plurality of lens elements, or "lenslets" 108 (shown as circles "o"). The lens elements 108 are arranged in an array of hundreds or thousands of rows and columns (only six rows and columns shown, for clarity), corresponding on a one-to-one basis to the underlying elements 102. The lenslets (lens elements) 108 are aligned over the photosensitive elements 102 in one of various ways discussed hereinbelow. Preferably, the lens elements 108 are formed as diffractive (binary) optical structures, but may be any lens or optical device which is capable of focusing an image onto the underlying photosensitive elements 102.

Although each lenslet 108 is generally directly over a corresponding photosensitive element 102, each pair of lenslets and corresponding photosensitive element is specifically arranged to sense a particular portion of an image being focused onto the substrate. This is accomplished in one of a variety of ways.

Figure 2A:
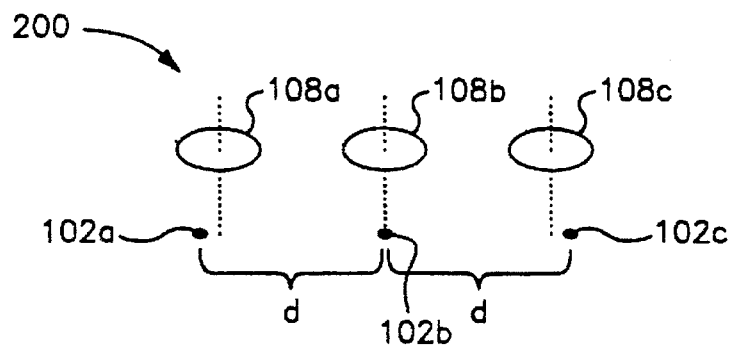
FIG. 2A is a diagrammatic representation of a physical offset between lenslets and photosensitive elements, according to the present invention.

FIG. 2A shows an arrangement 200 of three lens elements 108a, 108b and 108c, over, three corresponding photosensitive elements 102a, 102b and 102c. In this example, the photosensitive elements are arranged in a regular array, with constant spacing "d" therebetween. (This figure illustrates only three photosensitive elements and lens element.) However, the lens elements are arranged in an irregular array, with varying spacing. More particularly, the lens element 108a is physically offset in one or two dimensions from the photosensitive element 102a. The lens element 108b is physically aligned with (directly over) the photosensitive element 102b. The lens element 108c is physically offset in an opposite (from the offset of 108a) direction from the photosensitive element 102c. In this manner, specific portions (e.g., top left, center, bottom right, etc.) of an image being focused onto the substrate can be focused onto specific photosensitive elements 102. Each photosensitive element 102 will provide information relating to one "pixel" of the image being focused onto the substrate. In aggregate, the plurality of photosensitive elements will provide pixel information for the entire image of interest—each pixel representing a particular location on the image. The various physical offsets of the lens elements are arranged to effect this result, namely by covering the entire two dimensional field of the image.

Figure 2B:
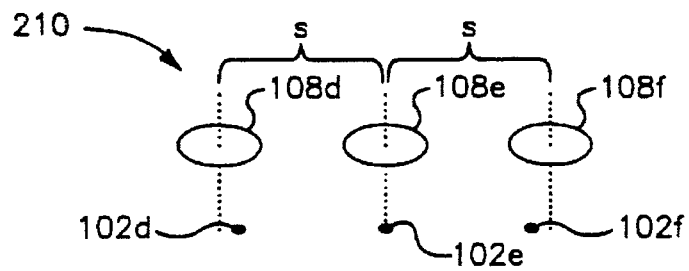
FIG. 2B is a diagrammatic representation of an alternate embodiment of a physical offset between lenslets and photosensitive elements, according to the present invention.
Figure 2C:
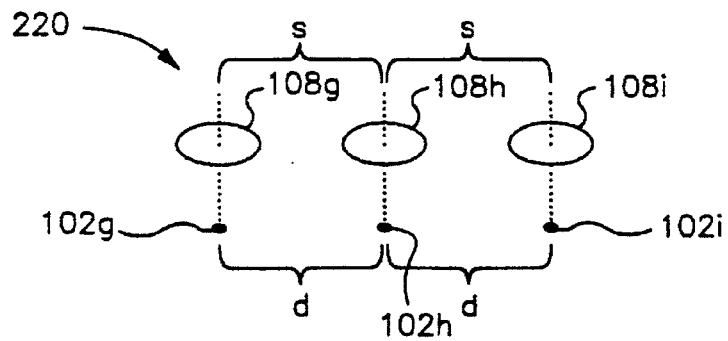
FIG. 2C is a diagrammatic representation of an embodiment of a virtual (rather than physical) between lenslets and photosensitive elements, according to the present invention.

FIG. 2B shows an alternate arrangement 210 of three lens elements 108d, 108e and 108f, over three corresponding photosensitive elements 102d, 102e and 102f. In this example, the lens elements are arranged in a regular (evenly spaced) array, with constant spacing "s" therebetween. However, the photosensitive elements are arranged in an irregular (varying spacing) array. More particularly, the photosensitive element 102d is physically offset in one or two dimensions from the lens element 108d. The photosensitive element 102e is physically aligned with (directly under) the lens element 108e. The photosensitive element 102f is physically offset in an opposite (from the offset of 102e) direction from the lens element 108f. In this manner, specific portions (e.g., top left, center, bottom right, etc.) of an image being focused onto the substrate can be focused onto specific photosensitive elements 102. Each photosensitive element 102 will provide information relating to one "pixel" of the image being focused onto the substrate. Again, in aggregate, the plurality of photosensitive elements will provide pixel information for the entire image of interest—each pixel representing a particular location on the image. The various offsets of the photosensitive elements are arranged to effect this result, namely by covering the entire two dimensions of the image. FIG. 2C shows an alternate arrangement 220 of three lens elements 108g, 108h and 108i, over three corresponding photosensitive elements 102g, 102h and 102i. In this example, the lens elements are arranged in a regular array, with constant spacing "s" therebetween, and the photosensitive elements are arranged in a regular array with constant spacing "d" therebetween. In other words, the lenslets are all physically aligned with the underlying photosensitive elements, with no physical offset. In the event that all of the lenslets 108g, 108h and 108i were formed the same (same focusing parameters) as one another, this would result in all of the photosensitive elements 102g, 102h and 102i providing the same pixel information as the remaining photosensitive elements. Therefore, the lens elements 108g, 108h and 108i are each formed as binary (diffractive) optics, with unique focusing characteristics. More particularly, the lenslet 108g is formed with its focal point offset in one or two dimensions from the photosensitive element 102g. The lenslet 108h is formed with its focal point aligned with the photosensitive element 102h. The lenslet 108i is formed With its focal point offset in an opposite direction (vis-a-vis the lenslet 108g) from the photosensitive element 102e and is physically aligned with the lens element 102i. This provides a "virtual" offset for each pair of lenslets and photosensitive elements, in marked contrast to the "physical" offsets described with respect to FIGS. 2A and 2B. However, the result is similar in that, specific portions (e.g., top left, center, bottom right, etc.) of an image being focused onto the substrate can be focused onto specific photosensitive elements 102. Each photosensitive element 102 will provide information relating to one "pixel" of the image being focused onto the substrate. Again, in aggregate, the plurality of photosensitive elements will provide pixel information for the entire image of interest—each pixel representing a particular location on the image. The various virtual offsets are arranged to effect this result, namely by covering the entire two dimensions of the image.

The commonality between the arrangements of FIGS. 2A, 2B and 2C is that the relative orientation (whether physical or virtual or in combination) of the lenslets and photosensitive elements is arranged so that light from a selected portion of an image being focused by the lenslets onto the substrate is focussed onto only one of the photosensitive elements, and in aggregate the photosensitive elements .of the array provide a complete pixel-by-pixel image (i.e., signals representative of the incident image).

In the arrangements 200, 210 or 220 of FIGS. 2A 2B or 2C, light from a particular portion of an image being focused onto the die (substrate) is, however, focused by all of the lens elements 108 onto the substrate. However, the light from a particular portion of the image is focused onto only one of the photosensitive elements 102. For the remainder of the photosensitive elements 102, the light from that particular portion of the image is focused onto the front surface of the substrate in areas between photosensitive elements 102. It is within the scope of this invention that there may well be circuitry (e.g., image processing circuitry) formed on the front surface of the substrate in the areas between photosensitive elements 102 or in any other appropriate areas. Such circuitry may be adversely affected by light. Hence, these areas between photosensitive elements are preferably "masked" with an opaque layer, such as silicon nitride, aluminum or opaque photoresist (ink).

Figure 3:
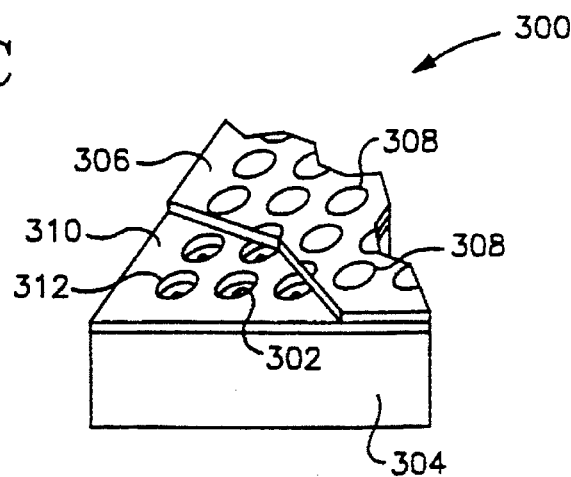
FIG. 3 is a partially cut-away, perspective view of an alternate embodiment of the invention.

FIG. 3 shows an arrangement 300 similar to that of FIG. 1. However, in this example, a optically-opaque layer 310 is applied over the substrate 304, and over any circuit elements (not shown) on the surface of the substrate. The layer 310 is formed of any suitable material, such as silicon nitride, opaque photoresist, or the like, and is applied so as to have openings 312 (holes) in registration with the plurality of photosensitive elements 302 on the surface of the substrate. As in FIG. 1C, the array of photosensitive elements may cover only a portion of the surface of the substrate. An optically transmissive layer 306 is applied over the masking layer 310, and can be applied to fill the holes while maintaining a relatively planar surface. The layer 306 can also be chemical-mechanically polished prior to forming lenslets in its exposed surface. Lenslets 308 (preferably diffractive) are formed (or deposited) in the optically transmissive layer. The techniques discussed with respect to FIGS. 1A, 1B, 2A, 2B and 2C are applicable with this arrangement which uses an additional masking layer 310.

In certain applications, it may be desirable to space the lens elements (e.g., 108, 308) further away from the photosensitive elements (e.g., 102, 302), while maintaining the integral structure of the substrate, photosensitive elements, masking layer (if used) and lens elements. This will allow greater flexibility in the design of the lenslets, such as increased depth of focus.

Figure 4:
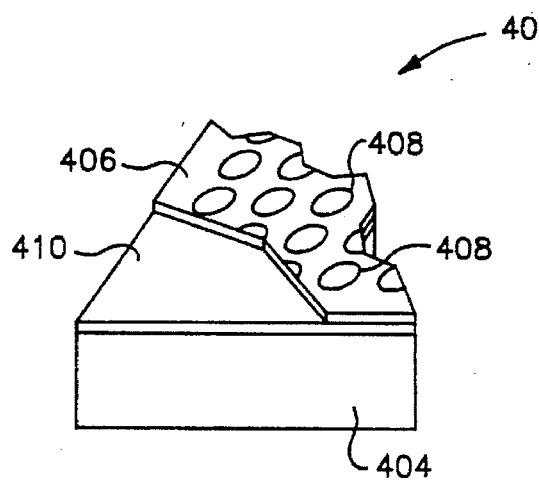
FIG. 4 is a partially cut-away, perspective view of yet another embodiment of the invention.

FIG. 4 shows an arrangement 400 similar to that of FIG. 1. However, in this example, an optically-transmissive layer 410 is applied over the substrate 404, and over any circuit elements (not shown) on the surface of the substrate. The layer 410 is preferably applied with uniform thickness, compensating for topological non-uniformities that may be caused by the underlying photosensitive elements (not shown) on the surface of the substrate. The layer 410 is formed of any suitably optically-transmissive material, such as silicon dioxide ($SiO_2$), spin-on glass, re-flow glass, photoresist, spin-on photoresist, re-flow photoresist or the like, and is preferably of substantially uniform thickness. Spin-on and re-flow techniques provide relatively uniform thickness layers. In the event that the thickness of the layer 410 is non-uniform, as initially applied, it is preferably planarized by chemical-mechanical polishing techniques, or the like. Alternatively, the layer 410 can be applied as a sedimentary layer of relatively uniform thickness, as discussed hereinabove.

Whereas in FIG. 3, the layer 310 acted as a masking layer, to prevent light focused away from a photosensitive element from impacting on circuit elements between photosensitive elements, in this example, the layer 410 acts as a "standoff" to establish a suitable (increased) spacing for the overlying layer 406 containing lenslets 408.

As in FIG. 1C, the array of photosensitive elements in the arrangement 400 may cover only a portion of the surface of the substrate. Further, the techniques discussed with respect to FIGS. 1A, 1B, 2A, 2B and 2C are applicable with the spacing layer 410.

Figure 4A:
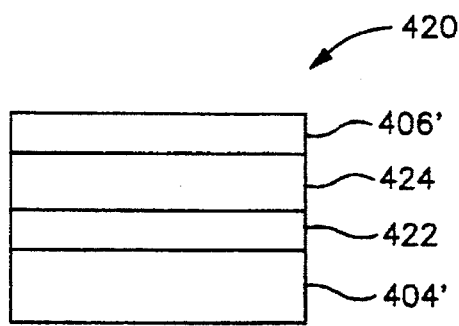
FIG. 4A is a side view of yet another embodiment of the invention.

FIG. 4A shows an arrangement 420 wherein the teachings of FIGS. 3 and 4 are applied in combination. In this example, a masking layer 422 (similar to 310) is applied over the substrate 404', with holes (not shown) aligned with the photosensitive elements (not shown). An optically-transmissive standoff layer 424 (similar to 410) is applied over the masking layer 422. An optically-transmissive layer 406' is applied over the optically-transmissive standoff layer 424, and is provided with lenslets (not shown). The techniques discussed with respect to FIGS. 1A, 1B, 1C, 2A, 2B and 2C are applicable in this arrangement 420.

Figure 4B:
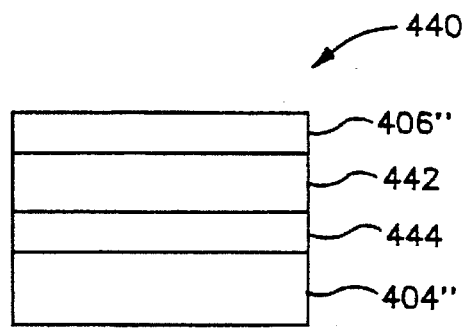
FIG. 4B is a side view of yet another embodiment of the invention.

FIG. 4B shows an arrangement 440 wherein the teachings of FIGS. 3 and 4 are applied in combination. In this example, an optically-transmissive standoff layer 444 (similar to 410) is applied over the substrate 404". An opaque masking layer 442 (similar to 310) is applied over the standoff layer 444, and has holes aligned with the photosensitive elements (not shown). An optically-transmissive layer 406" is applied over the masking layer 442, and is provided with lenslets (not shown). The techniques discussed with respect to FIGS. 1A, 1B, 1C, 2A, 2B and 2C are applicable in this arrangement 420.

Having created a sizeable spacing between the lens elements (e.g., 108, 308, 408) and the photosensitive elements (e.g., 102, 302, 402), alternative and additional arrangements of lens elements can be implemented.

Figure 5:
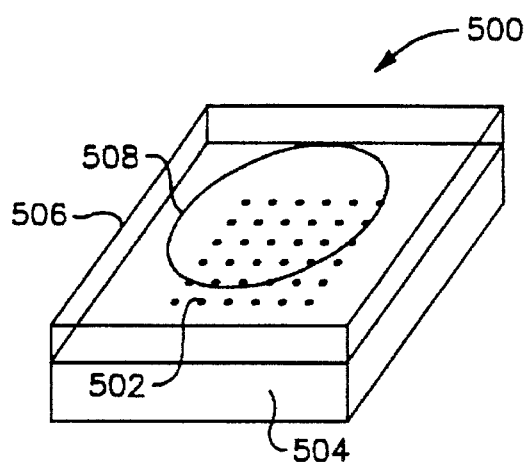
FIG. 5 is a perspective view of yet another embodiment of the invention.

FIG. 5 shows an arrangement 500 wherein a single, large lens element 508 is formed in an optically-transmissive layer 506 overlying an array of photosensitive elements 502 on a substrate 504. Preferably, the lens element 508 is formed as a single binary (diffractive) optical device, covering the entire array of photosensitive elements 502. The techniques discussed with respect to FIGS. 1A, 1B, 1C, 3, 4, 4A and 4B are applicable in this arrangement 500. Preferably, an optically-transmissive layer (not shown) is interposed between the single large lens element 508 and the surface of the substrate 504 (compare the optically-transmissive layer 410 of FIG. 4).

Figure 6:
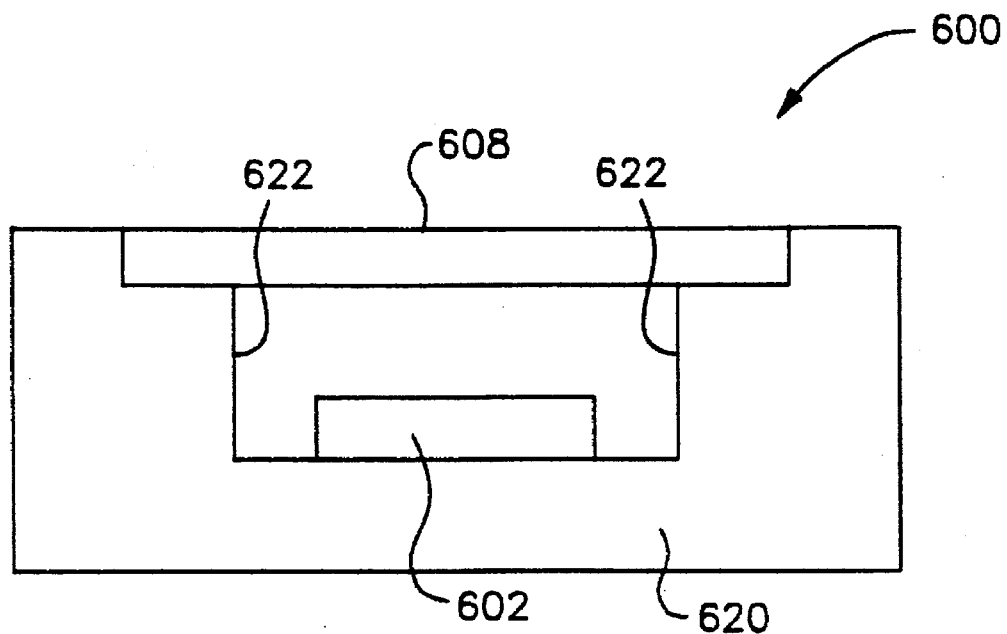
FIG. 6 is a cross-sectional view of yet another embodiment of the invention.

FIG. 6 shows an arrangement 600 where the lens element 608 is not-integral with the substrate (as it was in the previous embodiments/arrangements). Rather, in this arrangement, a lens element 608 is mounted to vertical spacing members such as pins, posts, shims, or the side walls 622 of a package 620, or the like, containing the substrate 602 (array of photosensitive elements not shown). The side walls 622 of the package body establish a known standoff for the lens element (i.e., distance between the lens element and the photosensitive array on the surface of the die). With the substrate 602, and the photosensitive array located in a predetermined location between the side Walls 622, an accurate X-Y alignment of the lens 608 over the photosensitive array occurs. The lens element 608 is preferably a refractive optic, similar to those described above (e..g., 108, 308, 408, 508), but in this case is non-integral with the substrate. Further, the techniques discussed with respect to FIGS. 1A, 1B, 1C, 2A, 2B and 2C are applicable in this arrangement 600.

It is within the scope of this invention to provide "mixed" optics comprising a combination of conventional (including refractive) lenses and binary refractive or diffractive lenses. For example, the lens element 608 can be formed as a conventional refractive lens which is also etched with a diffractive optical pattern. Such combination lens arrangements could be used in any lens application (e.g., 108, 208, 308, 408, 508).

Figure 7:
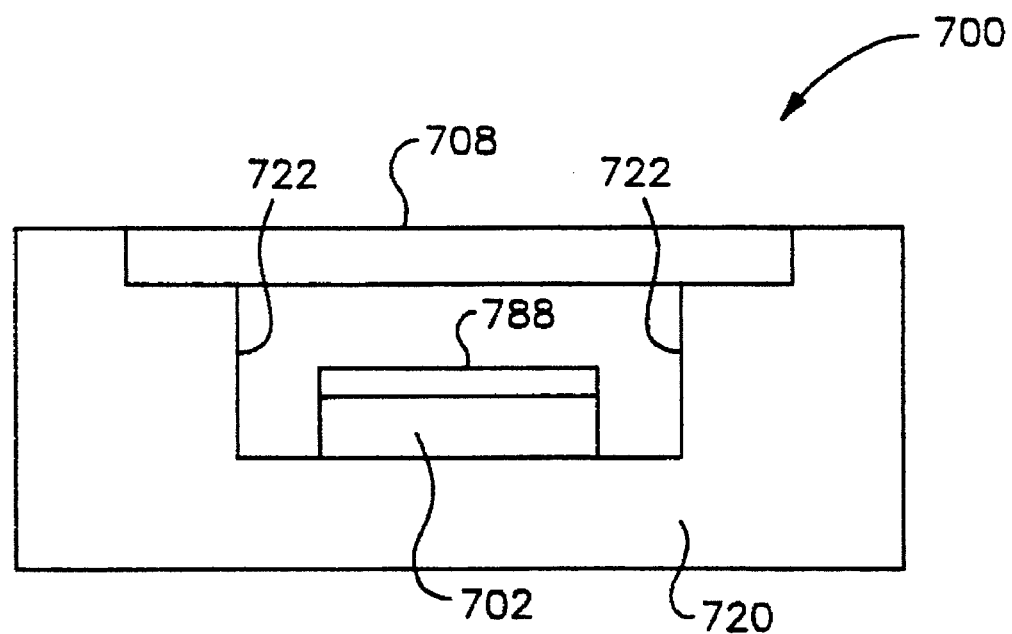
FIG. 7 is a cross-sectional view of yet another embodiment of the invention.

FIG. 7 shows an arrangement 700 similar to that of FIG. 6, in that a lens element 708 is supported above the substrate 702 by vertical pillars or posts/pins/shims, such as the side walls 722 of a package 720 (similar to 620), or the like. (The photosensitive array on the front surface of the die/substrate is not shown.) However, the substrate is also provided with an integral optic 788 on its front surface. Two variations are possible: (1) the lens element 708 can be a conventional refractive lens, and the substrate-integral optic 788 can be similar to any of the above-described diffractive elements (e.g., 108, 308, 408, 508), or (2) the lens element 708 can be similar to any of the above-described diffractive elements (e.g., 108, 308, 408, 508), and the lens element 788 can be a conventional refracting lens mounted to the surface of the substrate. Additionally, either lens element 708 or 788 may be a combination lens of conventional cum binary or conventional cum refractive lenses. Further, the techniques discussed with respect to FIGS. 1A, 1B, 1C, 2A, 2B and 2C are applicable in this arrangement 600. In this manner, the "mixed" optics 708 and 788 can be designed to eliminate spherical and/or chromatic aberration. Filters may also be used to remove light having a wavelength subject to chromatic aberration and not otherwise corrected for by the use of "mixed optics".

The preceding arrangements are generally best suited for monochromatic imaging. There also exists a viable requirement for color imaging. Color imaging is typically accomplished with three optical systems, each responsive to a different color of light, such as red (R), green (G) and blue (B). Each system comprises a lens, a filter and an associated photodetector (array). Such triplication of elements is, evidently, costly compared to a single system.

Figure 8:
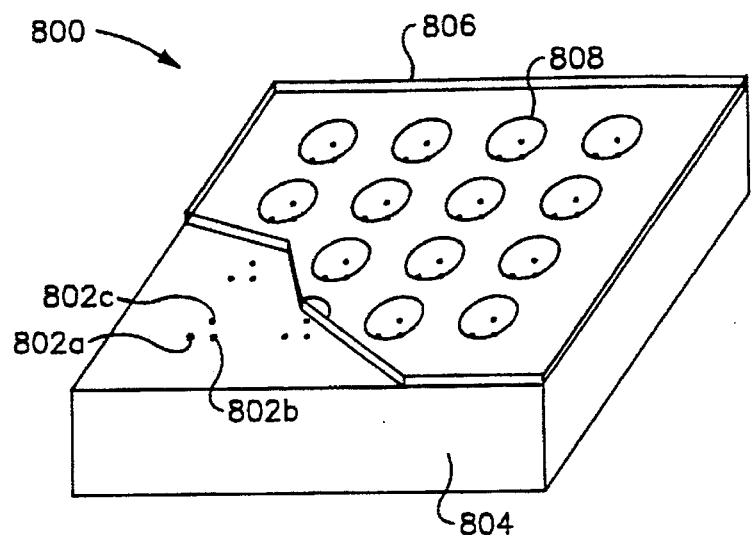
FIG. 8 is a partially cut-away, perspective view of yet another embodiment of the invention.

FIG. 8 shows an arrangement 800 suited for color imaging. An array of photosensitive elements 802 are arranged on the front surface of a substrate 804, in a manner similar to the photosensitive elements 102 (e.g.). However, in this arrangement 800, at each array location, there are three closely-grouped together photosensitive elements ("triplets") 802a, 802b, 802c, rather than a single photosensitive element 102. A 4×4 array is shown, for illustrative clarity. An optically-transmissive layer 806 (similar to 106) is formed over the array of photosensitive element triplets. In this case, there is one lenslet 808 for each "triplet" of photosensitive elements. The lens elements are preferably formed as diffractive elements (or a combination lens), and are designed to have different focal points for different wavelengths of light. For example, red (R) light can be focused onto the element 802a of a triplet, green (G) light can be focused onto the element 802b of the triplet, and blue (B) light can be focused onto the element 802c of the triplet. In this manner, color imaging can be achieved. The techniques discussed above, with respect to offsets (so that each triplet represents a pixel of the incident image), masking and transparent layers interposed between the lens element layer (806) and the substrate, supporting the lens structure or another lens structure on a package or the like, providing "mixed" optics, etc., are applicable to the technique of grouping three photosensitive elements at each array (pixel) location.

Figure 9:
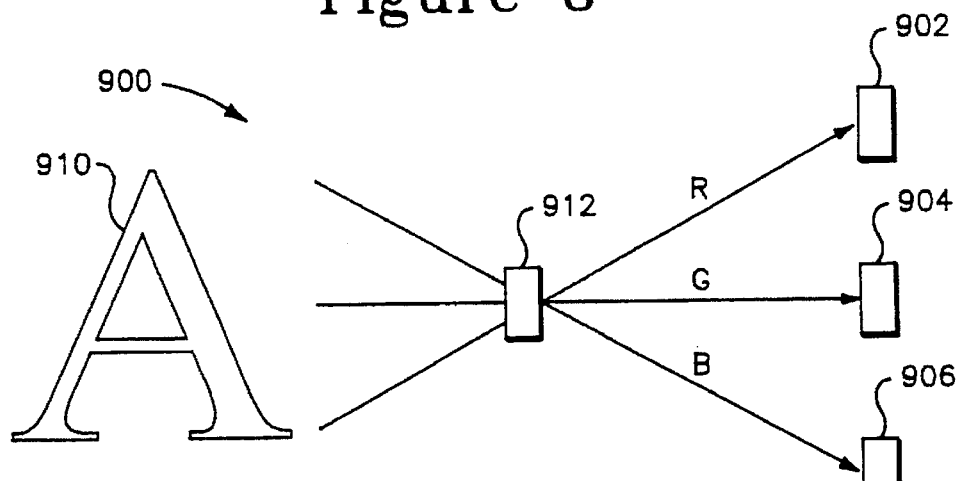
FIG. 9 is a diagrammatic representation of yet another embodiment of the invention.
Figures 9A, 9B:
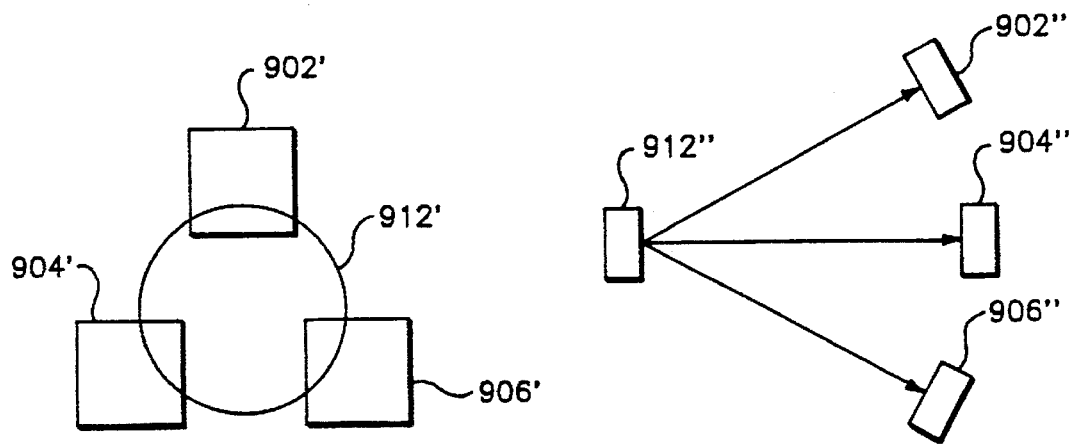
FIG. 9A is a diagrammatic representation of yet another embodiment of the invention.
FIG. 9B is a diagrammatic representation of yet another embodiment of the invention.

FIG. 9 Shows an alternate arrangement 900 of a color capable solid state image sensor. Whereas the arrangement of FIG. 8 employed a single substrate (die), and triplets of photosensitive elements, in this arrangement 900, three solid-state image sensors 902, 904, 906 are employed, each of which is suited to monochromatic image sensing. Each image sensor 902, 904, 906 is formed in a manner-similar to the sensor 100 of FIG. 1 (and the enhancements to the FIG. 1 embodiment, discussed hereinabove, are equally applicable). An image 910 ("A") is focused by any suitable optics (not shown) through a beam splitter 912. The beam splitter 912 is preferably a diffractive optic that is designed to direct different wavelengths of light at different angles. For example, the beam splitter 912 directs red (R) light towards the sensor 902, directs green (G) light towards the sensor 904, and directs blue (B) light towards the sensor 906. The beam splitter 912 can be designed to accommodate a linear, planar arrangement of sensors 902, 904, 906, as shown. Alternatively, the three sensors 902', 904' and 906' can be arranged in a planar, triangular (e.g., equilateral)

pattern, as shown in FIG. 9A, so that the angles to each of the sensors from the beam splitter 912' are preferably, but not necessarily equal but differently oriented. Alternatively, the three sensors 902", 904", 906" can be arranged in a curved, linear array, as shown in FIG. 9B, so that the distance from the beam splitter 912" to each of the sensors is the same to produce equivalent imaging (else,. suitable correlation of data can be done if the distances are varied). The distance can correspond to the focal length (in the usual sense of the term) of the lens. Alternatively, the distance can be sufficient to permit a predetermined mapping of the image onto the sensors. The mapping may be either a one-to-one mapping or may instead be sufficient to be used in combination with a compression or decompression algorithm. The term "focal length" as defined herein for each of the embodiments of the present invention should be construed to include both of these definitions, and specifically to include the distance necessary to produce a focal plane image with one-to-one correspondence with a "viewed" object, in addition to the usual meaning of the term "focal length."

The three sensors of any of these embodiments (FIGS. 9, 9A, 9B) can be arranged on .any suitable mounting substrate. For example, the three sensors of FIGS. 9A and 9B can be disposed in a package similar to that of FIGS. 6 or 7. For example, the optical element 708 of FIG. 7 could function as a beam splitter (912), and three Sensors, each having its own integral focusing optic could be disposed within the cavity of the package (each in a manner similar to 702/788).

Figure 10:
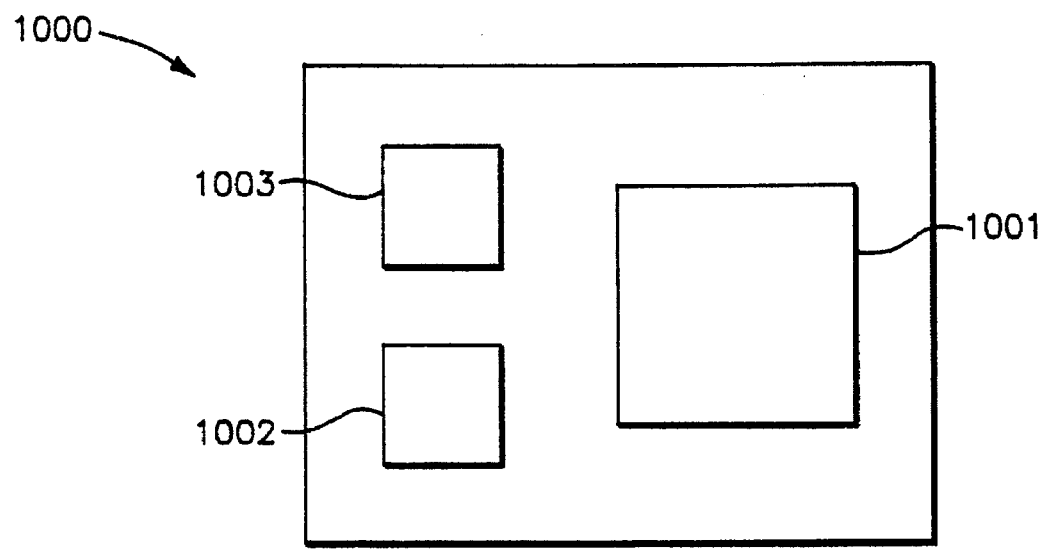
FIG. 10 is a diagrammatic representation of yet another embodiment of the invention.

FIG. 10 shows a chip 1000 including an image sensing array 1001. In the preferred embodiment shown in FIG. 10, the chip also includes a logic array 1002 for processing the signals generated by the array 1001. The chip may also include a memory array 1003 for storing signals generated by array 1001 or array 1002. The logic array 1002 and/or memory array 1003 can be an embedded array as described in, e.g., U.S. patent application Ser. No. 07/596,680. In one embodiment, the memory array 1003 can be a "cache memory."

Figure 11:
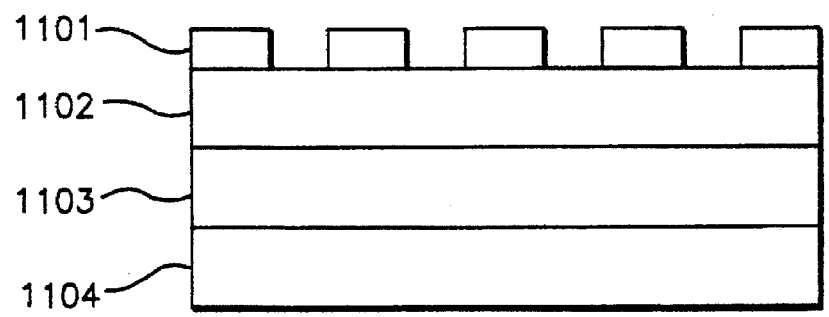
FIG. 11 is a cross-sectional representation of yet another embodiment of the invention.

FIG. 11 shows a cross-sectional view of a method of forming a chip in accordance with an embodiment of the present invention. A substrate 1104 is coated successively with a first optically transmissive layer 1103, such as spun-on glass, a second optically transmissive layer 1102, such as pyrolitic silicon dioxide, and a layer of photoresist 1101. The photoresist 1101 is exposed and developed by conventional techniques. The photoresist 1101 is then used as a mask to etch second optically transmissive layer 1102. Any suitable etching technique can be used. Preferably, reactive ion etching is used when vertical sidewalls are desired. Wet chemical etching may also be used, alone or in combination with reactive ion etching, to create more rounded geometries where appropriate. In a preferred embodiment, a laser beam is used to improve the shape of the lens, and to correct any defects in the lens shape which may be detected during testing. If desired, the entire lens may be shaped by the use of the laser. This avoids the need for masking and etching, but reduces throughput.

Diffractive lenses for use in accordance with the present invention may be produced by any suitable technique. In one embodiment of the present .invention, such lenses are shaped by chem-mech polishing or etching.

Figure 12:
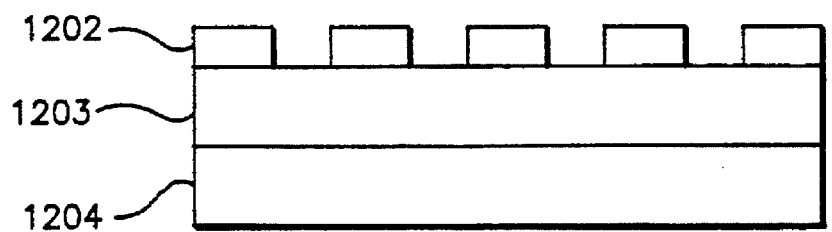
FIG. 12 is a cross-sectional representation of yet another embodiment of the invention.

The result is shown in FIG. 12. In FIG. 12, layer 1202 represents the second optically transmissive layer after the coating and etching step. In this Figure, layer 1202 has been formed into a fresnel or binary lens structure. The first optically transmissive layer 1203 provides a gap between the substrate 1204 which permits the lens 1202 to focus an image on an appropriate area of the substrate 1204 having one or more image sensing devices.

FIG. 13 is a cross-sectional view of a television camera 1300, incorporating a solid state image sensor 1310 of the type described hereinabove. Any of the solid-state image sensors described hereinabove are suitable in this arrangement, for example, 300 as described hereinabove with respect to FIG. 3. The image sensor 1310 is mounted within a housing 1320, and provides a video output signal 1312. A variable focus optical system 1330 is mounted to the housing 1320 over the solid-state image sensor 1310. Because of the small size of the solid-state image sensor, it is possible to provide an extremely small camera capable of application in very tight spaces or in applications, such as security systems, where it may be desirable that the camera be hidden.

The variable focus optical system 1330 is shown having one or more lenses, such as lenses 1340 and 1350, which may be conventional, binary, or other refractive or diffractive or combination lenses, with a sliding system 1360, well known in the camera technology, to vary the focal length. Other means for varying the focal length are contemplated.

The variable focus optical system 1330 is not essential to the operation of the television camera 1300, since the solid-state image sensors described herein have built-in optical systems providing fixed-focus. However, the variable focus optical system 1330 permits alteration of the basic focal length of the solid-state image sensor 1310 and provides a wider range of distances over which the camera 1300 will operate effectively.

Such a camera 1300 may also be equipped with an aperture control 1380 (such as an iris) to control the intensity of light transmitted to the image sensor. Alternatively, or in combination, circuitry could be utilized with the image sensor to enhance or subdue sensitivity to variable ambient light characteristics about the camera/sensor.

Alternatively, a fixed-focus optical system (such as in FIG. 13, but without the sliding system 1360) could be substituted for the variable focus optical system 1330 to provide a different focal length than that provided by the solid-state image sensor for such specialized applications as dedicated inspection systems, microscope cameras, telescope cameras, etc..

FIG. 14A is a block diagram of a basic security system comprising a television camera 1410a of the type (1300) described with respect to FIG. 13 and television monitor 1430a. A video signal 1420 representing an image "seen" by the camera 1410a is connected to the monitor causing a representation of the image to be displayed on the monitor 1430a. An intermediate memory or processor may be utilized to store or modify the signal 1420 prior to display. The extremely small camera size afforded by the application of a solid-state image sensor permits applications involving location and positioning of the camera 1410 in places which might otherwise be difficult or impossible.

FIG. 14B is a block diagram of a video-telephone system 1400b comprising a camera 1410b of the type (e.g., 1300) described hereinabove with respect to FIG. 13, a transmitting line interface 1440b, a receiving line interface 1440b, and a television monitor 1430b. A video signal 1420b from the camera 1410b is interfaced to and transmitted over a communication line 1450b by the transmitting line interface 1440b. The communication line 1450b may be, for example, a dialed telephone connection across a commercial switched telephone network. The receiving line interface 1440b converts the signal received over the communication line back into a video signal and transmits it through line 1460b (for possible storage by memory and/or signal processing—not shown) before or after is may be displayed on the monitor 1430b.

The foregoing discussions have been concerned primarily with solid-state image sensors and applications thereof. The following discussion with respect to FIGS. 15, 16A–D, and 17A–C are directed to combined arrangements of solid-state image sensors and LCD display panels. These combined arrangements are effectively image-sensing display panels capable of both image display and image capture. LCD panels, for display purposes, are well known.

FIG. 15 is a view of a combined display and image sensor 1500. A solid state image sensor 1510 ("camera") providing a "Camera" output signal 1515 (video signal) and an LCD (Liquid Crystal Display) Panel (Display) 1520 are mounted side-by side on a common substrate (backing) 1530. The LCD may alternatively be a plasma screen display or other suitable display means for the purpose, all included in the term "LCD" or "Liquid Crystal Display". An electrical interface 1525 to the LCD panel 1520 provides data to be displayed on the LCD panel. The "camera" output signal 1515 is an electrical analog of the image "seen" by the solid-state image sensor 1530.

Figure 16A:
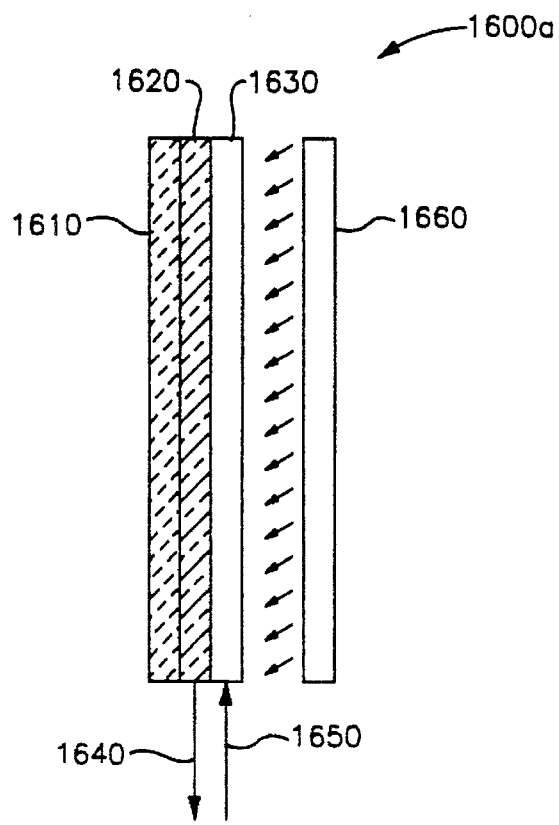
FIGS. 16A–16C are cross-sectional views of various "sandwiched" display and solid-state image sensor arrangements, according to the invention.

FIGS. 16A is a view of a sandwiched display/image sensor arrangement. A binary optic element 1610 (e.g., lens element 788, FIG. 7) or a combination lens element is disposed over a an array of photo-sensitive elements 1620 (e.g., 702, FIG. 7 or 802, FIG. 8). These two elements are disposed over an LCD display panel 1630. The binary optic element 1610 and array of photo-sensitive elements 1620, in combination, form an image sensor. The image sensor, via the array of photo-sensitive elements 1620, produces a video output signal 1640, representative of an image "seen" by the array 1620. The LCD display panel 1630 is responsive to signals on an LCD electrical interface 1650 to produce a visible image. The binary optic element 1610 and array of photo-sensitive elements 1620 are sufficiently transmissive of light that an image displayed on the LCD display panel 1630 may be seen through them by an observer. The visibility of the image on the LCD display panel may be augmented through the use of back-lighting means 1660 (light shown as arrows (↙)) such as an electro-luminescent panel ("EL" panel) or fluorescent lighting tubes.

Figure 16B:
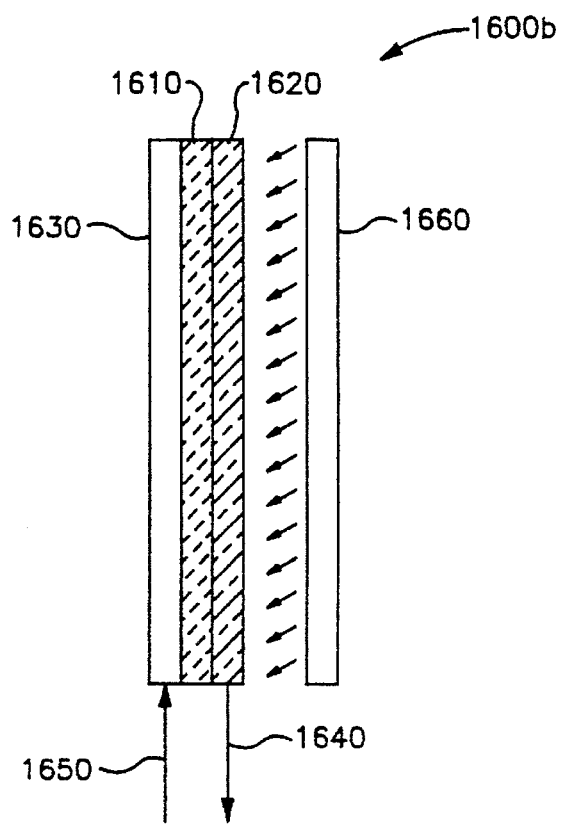

FIG. 16B is a view of another embodiment 1600b of a sandwiched display/image sensor arrangement, similar to that described with respect to FIG. 16A. All of the same elements (binary or combination optic element 1610, photo-sensitive array 1620, and LCD display panel 1630) are employed in this display/image sensor arrangement 1600b, but are arranged in a different order. In this embodiment, the LCD display panel 1630 overlies the binary optic element 1610, which in turn overlies the photo-sensitive array 1620. As is known in the art, an LCD panel (e.g. 1630) can be made to be either selectively opaque or transmissive of light, depending upon signals applied thereto via its electrical interface (e.g., 1650). By causing the display panel 1630 to be transmissive of light (transparent) by applying appropriate electrical signals via the electrical interface 1650, sufficient light reaches the photo-sensitive array to cause an image to be formed thereupon. This image is then converted by the photo-sensitive array 1620 into an electrical video signal 1640 which is representative of the image. It is also possible, by making the LCD panel 1630 opaque, to block light to the photo-sensitive array 1620, thereby blocking any image which would otherwise be formed thereupon. Additionally through memory or processing means (not shown) described previously, the LCD panel 1630 may display a separate image than what is being viewed by the photosensitive array 1620.

As in the embodiment of FIG. 16A, signals provided to the LCD panel 1630 over the LCD electrical interface 1650 permit an image to be formed on the LCD panel in the form of opaque and transmissive areas on the LCD panel. The viewability of this image may be augmented by back-lighting means 1660. Such systems, shown in FIGS. 16A–C, could also display in color with color LCD panels or the like in combination with, for example, a color photo-sensitive array system (e.g., 800, FIG. 8).

Figure 16C:
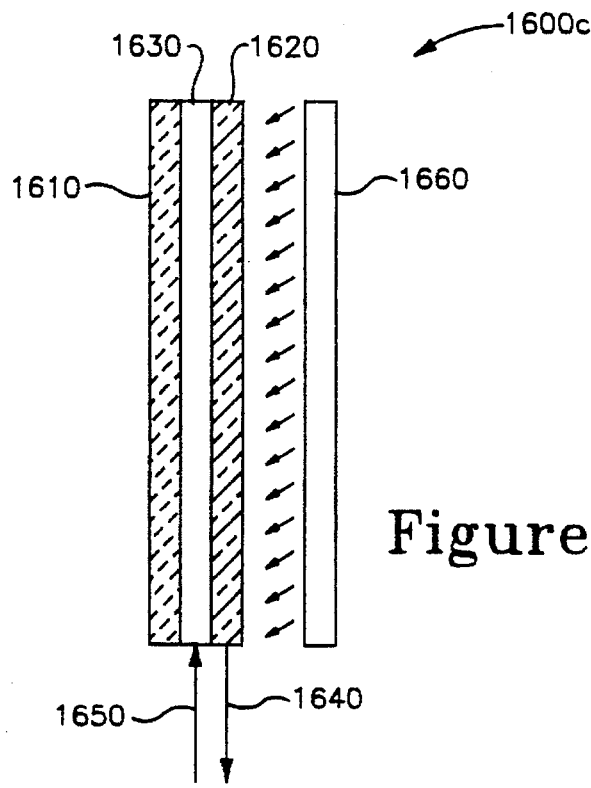

FIG. 16C is a view of another embodiment 1600c of a sandwiched display/image sensor arrangement, including means 1660 for back-lighting. In this embodiment 1600c, the binary optic element 1610 overlies the LCD panel 1630, which in turn overlies the photo-sensitive array 1620. The binary optic or combination element 1610 is sufficiently transmissive of light that an image formed on the LCD panel 1630 may be viewed through the binary optic element 1610. The LCD panel 1630 can be made sufficiently transmissive of light (by application of appropriate signals to the LCD electrical interface 1650) to permit an image to be formed through the binary optic element 1610 and LCD panel 1630 onto the photo-sensitive array 1620. The back-lighting means 1660, enhances the viewability of any image on the LCD panel 1630.

For the sandwiched display/image sensor arrangements 1600a–1600c described hereinabove, it is possible, by multiplexing the operation of the LCD display panel 1630 and the photo-sensitive array 1620, to simultaneously display a viewable image on the LCD display panel 1630 and to capture and transmit an image formed on the photo-sensitive array 1620. This is accomplished by rapidly alternating the LCD display panel 1630 between displayed image and a transparent (transmissive) state via the LCD electrical interface 1650. For the embodiments of FIGS. 16B and 16C (1600b and 1600c, respectively), the video signal 1640 is monitored only when the LCD display panel 1630 is in its transparent state. The alternation of the LCD display panel 1630 occurs at a rate sufficiently high that a human observer does not notice any significant "flicker" of the image. For the embodiment of FIG. 16A (1600a) the display may be monitored when the display is in either state.

Any of the three embodiments may employ back-lighting (e.g., 1660, FIG. 16C), but back-lighting will generally interfere with the operation of the photo-sensitive array 1620. As a result, it is necessary to "turn off" the back-lighting means 1660 while the video signal 1640 from the photo-sensitive array 1620 is being monitored. The embodiment of FIG. 16A (1600a) provides a convenient method for accomplishing this. Since the LCD display panel 1630 is behind the photo-sensitive array 1620, placing the LCD display panel 1630 into a completely opaque state would cause any light from back-lighting means (e.g., 1660) placed behind the LCD-display panel 1630 to be blocked. In this way, the LCD display panel 1630 acts as a sort of "shutter" between a back-lighting means and the photo-sensitive array 1620.

In this case, the back-lighting means would remain "on", and the LCD display panel 1630 would be caused to alternate between a displayed image and an opaque state. The video signal 1640 from the photo-sensitive array would then be monitored only when the LCD display panel 1630 is in the opaque state.

Alternatively, the LCD display panel 1630 can be selectively darkened (by pattern or "gray-scale") to limit the light that would impinge on the photo-sensitive array 1620 as another "shutter" means or light intensity control means where the panel 1630 is in front of the array 1620 (e.g., FIG. 16B and 16C).

It is also possible to provide an LCD display panel 1630 which, in its opaque state, blocks light frequencies Which are visible to the human eye, but passes some light frequencies (e.g., infra-red) which are outside of the range of frequencies visible to humans. Optical an optical filter may be employed to limit the light frequency response of the photo-sensitive array 1620. By using a photo-sensitive array 1620 which is made sensitive only to those frequencies passed by the LCD array 1630 which are not visible to the human eye, it is not necessary to alternate the LCD image, eliminating "flicker" entirely.

Further, if the photo-sensitive array 1620 is insensitive to the light frequency or frequencies produced by the backlighting means 1660, then it not necessary to modulate (switch on and off) the backlighting means 1660 while the photo-sensitive array is capturing an image.

FIG. 16D is a block diagram of an arrangement for accomplishing this alternating, multiplexed operation of a sandwiched display/image sensor arrangement 1600d. Any of the three aforementioned sandwiched display/image sensor arrangements 1600a–1600c may be used. A multiplexing circuit 1670 receives image data 1655 to be displayed on the LCD display panel 1630, and causes the LCD display panel 1630 to alternate between displaying the image and assuming either a transparent state (as described above with respect to 1600b or 1600c) or an opaque state (as describe above with respect to 1600a). The multiplexing operation is controlled by a synchronizing multiplex control signal 1690, which governs the rate and duty cycle at which the transparent (or opaque) state is assumed by the LCD display panel 1630. This same multiplex control signal 1690 is used to control when the video signal 1640 from the photo-sensitive array 1620 is monitored, so that the video signal 1640 is only "filtered" by the multiplexing circuit 1670. The "filtered" video signal is output by the multiplexing circuit 1670 as image sensor data 1645.

For large sandwiched display/image sensor arrangements, a large glass, ceramic or plastic may be used for the substrate of the photo-sensitive array, and the photo-sensitive elements may be disposed thereupon. This permits image sensors arrays of arbitrary size to be fabricated. Additionally, with all photo-sensitive elements as well as logic and memory circuit elements disposed on the display substrate, an efficient light-weight and easily manufactured system may be developed.

Alternatively, the substrate may be formed by depositing amorphous or poly-silicon on a continuous sheet of metal, such as aluminum. Techniques similar to this are currently employed in the production of photo-voltaic cells.

One embodiment of this type involves sizing and shaping such a large sandwiched display/image sensor arrangement to approximately match the size and shape of a "sheet" (of, e.g., 8.5 inch by 11 inch paper). The effective focal length and aim of the integral optically transmissive element (e.g., binary optics) would be provided such that an "image" of an object, such as a "sheet" of paper would be "seen" by the image sensor portion of the arrangement, permitting an electronic picture to be taken of the object. A sheet of paper could be held (or laid) directly on the image-sensing panel. This would provide a page-sized reader (such as optical character recognition (OCR) readers or graphics readers) in the same device as the display for computer systems and the like.

FIGS. 17A–C are views of various embodiments of a bracelet-mounted display/image sensor arrangement.

FIG. 17A is a view of an arrangement 1700a whereby a solid-state image sensor 1720 and an LCD display panel 1730 are mounted to a mounting surface 1725 attached to a bracelet-type band 1710, sized and shaped to fit around a human wrist. Alternatively, a clothes-pin or clip device may be used to hold the display/camera devices (1720, 1730). A housing 1740 with an optically transmissive element 1750 covers the LCD display panel 1730 and the solid-state image sensor 1720. The optically transmissive element may be a non-refractive element (e.g., a sheet of glass, quartz crystal, or transparent acrylic) or a refractive or diffractive or combination element (lens). Electronic control circuitry (not shown), which is powered (not shown) as by a battery, controls the operation of the LCD display panel 1730 and solid-state image sensor 1720.

FIG. 17B is a view of another similar arrangement 1700b, this time employing a sandwiched display/image sensor arrangement 1735. Electronic circuitry (not shown), such as that described hereinabove, controls the operation of the display/image sensor arrangement 1735. The arrangement 1735 may be of the forms shown in FIGS. 16A–C as 1600a, 1600b, or 1600c and may be backlighted.

FIG. 17C is a view of another similar embodiment 1700c, wherein a bracelet-type band 1710a has an integrally formed housing and mounting surface 1745. The optically transmissive element 1750 mounts directly to the bracelet-type band over the sandwiched display/image sensor arrangement 1735. As before, electronic circuitry (not shown), controls the operation of the display/image sensor arrangement 1735. Additionally, if the upper surface of the arrangement 1735 (or sensor 1720 and/or panel 1730) are sufficiently rugged, no upper element (or lens) 1750 may be needed.

The wrist band type sensor of FIGS. 17A–C would be suitable, with attendant communication circuitry, a microphone, audio-capture circuitry, audio reproduction circuitry and a speaker to be useful as a "Dick Tracy" type watch, enabling voice and picture communication, e.g., through a cellular phone system or other wireless communication means. Alternatively, such would be an excellent input and output device for, e.g., a computer or security system and could be connected to such system.

Figure 18:
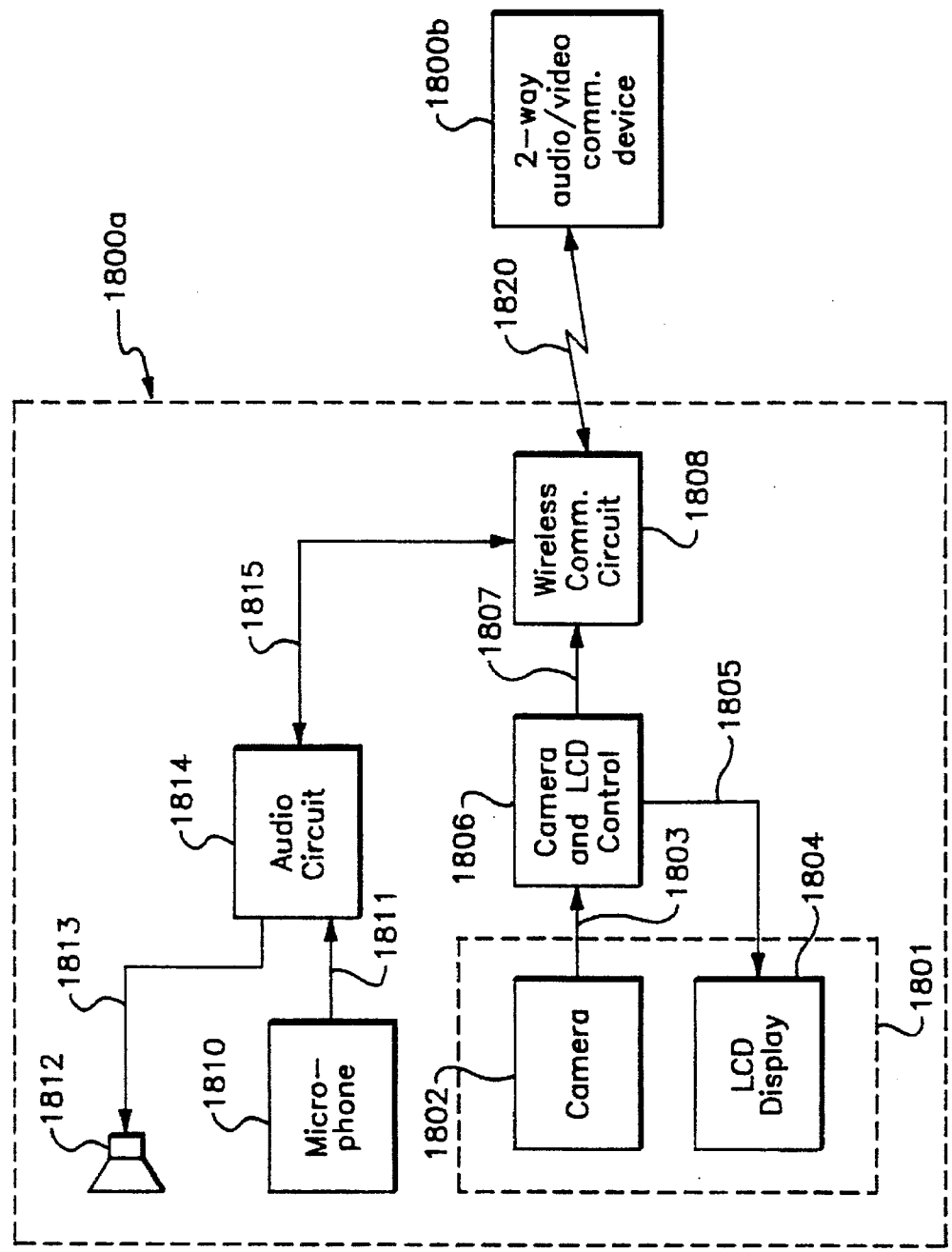
FIG. 18 is a block diagram of a 2-way audio/video communication device, according to the invention.

FIG. 18 is a block diagram of such a two-way voice and picture (audio/video) communication system. A first audio/video communication device 1800a, of the type mentioned above (e.g., "Dick Tracy" watch) transmits and receives communication signals 1820 over a wireless communition medium via a wireless communication circuit 1820, (e.g., a cellular telephone circuit). A camera chip 1802 of the type described hereinabove and an LCD display panel 1804, provide means 1801 for image capture and display. An image-sensing display panel of the type described hereinabove (e.g., 1600a, 1600b, or 1600c, FIGS. 16A–C) may be used to provide the camera 1802 and the LCD display panel 1804 in a single integral unit (1801). Camera and LCD control circuitry 1806 provides means for processing electrical signals 1805 from the camera 1802 and provides electrical signals 1803 to the LCD display 1804. An audio circuit 1814 connects to the wireless communication circuit 1808, exchanging audio signals 1815 with the wireless communication circuit 1808. The audio circuit 1814 receives an electrical signal 1811 from a microphone 1810 converting it into a form suitable for transmission by the wireless communication circuit 1808. The signals received (audio signals) from the wireless communication circuit 1808 by the audio circuit 1814 are converted by the audio circuit 1814 into speaker electrical signals 1813 to be reproduced a speaker 1813. It is known in the art to use a single transducer as both a speaker and a microphone. If this approach is used, a separate microphone (e.g., 1810) and speaker (e.g., 1812) are not required.

The first two-way audio/video communication device 1800*a* communicates via the communication signals with a second two-way audio/video communication device 1800*b*. The second communication device 1800*b* may be identical to the first communication device 1800*a*, or may be an equivalent device or devices, such as a conventional videophone.

It is within the purview of one skilled in the art to which the present invention most nearly pertains to implement monochromatic and color image sensors, using diffractive, refractive and/or combination optics, according to the techniques and arrangements set forth above. Certain modifications that may become apparent from study of this disclosure are intended to be within the scope of the present invention. Accordingly, the present invention is not limited to the embodiments disclosed in the instant specification, but is instead defined by the claims and the equivalents thereof.

What is claimed is:

1. An electronic device for generating a signal indicative of an image to be captured comprising:

a hollow housing;

means defining an opening in said housing for admitting light indicative of the image to be captured;

image sensor means formed on a semiconductor substrate and supported within said housing in a light path followed by the light within the housing for generating a potential difference upon incidence of light indicative of the image to be captured;

lens means disposed between said means defining an opening and said image sensor means in said light path for blocking and passing light to permit said image sensor means to produce at least one pixel indicative of said image to be captured;

display means having a transparent state and an opaque state disposed between said lens means and said image sensor means for helping to control the blocking and passing of light incident upon said image sensor means.

2. An electronic device for generating a signal indicative of an image to be captured according to claim 1, wherein the electronic device is a television camera; wherein said image sensor means includes an array of photosensitive elements formed on the surface of the semiconductor substrate; and wherein said lens means includes an optically transmissive layer above and contiguous with the array, wherein said transmissive layer focuses light onto said array.

3. An electronic device according to claim 1, wherein said lens means includes at least a pair of lens elements for focusing the light indicative of said image to be captured on said image sensor means to produce said at least one pixel indicative of said image to be captured.

4. An electronic device according to claim 1, wherein said light sensor means includes at least three photosensitive elements, each individual photosensitive element generating said potential difference upon incidence of light indicative of said image to be captured;

wherein said lens means include at least three lens elements for focusing light on the three corresponding photosensitive elements;

wherein at least one of the three photosensitive elements is offset in at least one the x and y dimensions relative to one of the three corresponding lens elements so that a specific portion of the image to be captured is focused onto a specific one of the three photosensitive elements; and wherein said three lens elements are arranged equally spaced apart with a constant spacing distance of s units therebetween.

5. An electronic device according to claim 1, wherein said light sensor means includes a layer of optically transmissive material formed on said semiconductor substrate.

6. An electronic device according to claim 1, further comprising:

a layer of optically-opaque material disposed on said layer of optically transmissive material for blocking selectively light travelling along said light path to prevent the blocked light from incidence upon said lens means.

7. An electronic device according to claim 1, further comprising:

a standoff layer of optically-opaque material disposed on said layer of optically transmissive material for spacing said lens means from said light sensor means for facilitating image focusing purposes.

8. An electronic device according to claim 1, wherein said lens means is a single binary optical device.

9. An electronic device according to claim 1, wherein said image sensor means includes a set of three image sensors for facilitating generating a signal indicative of a full color image; and wherein said lens means includes a beam splitter for directing different wavelengths of light at different angles to the three image sensors to further facilitate generating a signal indicate of said full color image.

10. An electronic device according to claim 1, further comprising:

logic means disposed on said semiconductor substrate for processing the signal indicative of the image to be captured.

11. An electronic device according to claim 1, further comprising:

a variable focus optical system mounted to said housing in alignment with said means defining an opening for facilitating focusing light along said light path to provide a wider range of distances over which the electronic device will operate effectively.

12. An electronic device according to claim 1, wherein said light sensor means includes at least three photosensitive elements, each individual photosensitive element generating said potential difference upon incidence of light indicative of said image to be captured;

wherein said lens means include at least three lens elements for focusing light on the three corresponding photosensitive elements;

said photosensitive elements being arranged equally spaced apart with a constant spacing distance of d units therebetween; and wherein at least one of the three lens elements is offset in at least one of the x and y dimensions relative to one of the three corresponding photosensitive elements so that a specific portion of the image to be captured is focused onto a specific one of the three photosensitive elements.

13. An electronic device according to claim 12, wherein each of the lens elements is formed with substantially the same focusing characteristics so that all of the photosensitive elements generate substantially the same electrical signal.

14. An electronic device according to claim 1, wherein said light sensor means includes at least three photosensitive elements, each individual photosensitive element generating said potential difference upon incidence of light indicative of said image to be captured;

wherein said lens means include at least three lens elements for focusing light on the three corresponding photosensitive elements;

said photosensitive elements being arranged equally spaced apart with a constant spacing distance of d units therebetween; and wherein said three lens elements are arranged equally spaced apart with a constant spacing distance of s units therebetween.

15. An electronic device according to claim 14, wherein each of the lens elements is formed with binary optics, each with a uniquely different focusing characteristics.

16. An electronic device according to claim 15, wherein one of the lens elements is formed with its focal point offset in at least one of two dimensions relative to its corresponding photosensitive element;

wherein another one of the lens elements is formed with its focal point offset in an opposite manner than the first mentioned lens element;

wherein still yet another one of the lens elements is formed with its focal point aligned with its corresponding photosensitive element; and wherein the alignment of the lens elements and the photosensitive elements provides a virtual offset for each pair of lens elements and corresponding pair of photosensitive elements.

17. An electronic device according to claim 16, wherein only one of the three lens elements will focus the image to be captured on its corresponding photosensitive element, and the other two lens elements focus the image to be captured onto non photosensitive portions of said substrate forming part of said image sensor means.

18. An electronic device according to claim 17, wherein said non photosensitive portions of said substrate are masked with a layer of opaque material.

19. An electronic device according to claim 18, wherein said layer of opaque material is selected from the group of silicon nitride, aluminum photoresist and opaque photoresist.

20. An electronic device according to claim 19, wherein said layer of optically transmissive material is formed on said semiconductor substrate in a uniform thickness to compensate for topological non-uniformities that may be caused by said light sensor means formed on the semiconductor substrate.

21. An electronic device according to claim 19, wherein said layer of optically transmissive material is selected from the group of silicon dioxide, spin-on glass, re-flow glass, photoresist, spin-on photoresist, and re-flow photoresist.

22. An electronic device according to claim 1, wherein said image sensor means includes:

a plurality of photosensitive elements formed on said semiconductor substrate, each individual element of said plurality of photosensitive elements generating said potential difference upon incidence of light indicative of said image to be captured.

23. An electronic device according to claim 22, wherein said plurality of photosensitive elements are arranged in a m by m square array of columns and rows on said semiconductor substrate.

24. An electronic device according to claim 22, wherein said lens means includes a plurality of lens elements for focusing the light indicative of said image to be captured on corresponding individual ones of said plurality of photosensitive elements to produce said at least one pixel indicative of said image to be captured.

25. An electronic device according to claim 24, wherein said plurality of lens elements are arranged in a m by m square array of columns and rows.

26. An electronic device according to claim 24, wherein said plurality of lens elements are arranged in a m by n rectangular array of columns and rows.

27. An electronic device according to claim 22, wherein said plurality of photosensitive elements are arranged in a m by n rectangular array of columns and rows on said semiconductor substrate.

28. An electronic device according to claim 27, wherein the individual elements in one row are offset from the individual elements in an adjacent row.

29. An electronic device according to claim 27, wherein the individual elements in one column are offset from the individual elements in an adjacent column.

30. An electronic device according to claim 27, wherein said lens means includes at least a pair of lens elements for focusing the light indicative of said image to be captured on an individual one of said plurality of photosensitive elements to produce said at least one pixel indicative of said image to be captured.

\* \* \* \* \*